(12) United States Patent
Perez-Lazcano et al.

(10) Patent No.: US 10,985,538 B2
(45) Date of Patent: Apr. 20, 2021

(54) SYSTEM AND METHOD FOR REDUCING AIR VOLUME IN A SPLITTER

(71) Applicant: LEONI Bordnetz-Systeme GmbH, Kitzingen (DE)

(72) Inventors: Fernando Perez-Lazcano, Höchberg (DE); Alexander Kett, Luhe-Wildenau (DE); Tuncer Gür, Würzburg (DE); Michaela Gau, Mainstockheim (DE)

(73) Assignee: LEONI Bordnetz-Systeme GmbH, Kitzingen (DE)

( * ) Notice: Subject to any disclaimer, the term of this patent is extended or adjusted under 35 U.S.C. 154(b) by 0 days.

(21) Appl. No.: 16/421,346

(22) Filed: May 23, 2019

(65) Prior Publication Data

US 2019/0363522 A1  Nov. 28, 2019

Related U.S. Application Data

(60) Provisional application No. 62/676,415, filed on May 25, 2018.

(51) Int. Cl.
*H02B 1/20* (2006.01)
*H02B 3/00* (2006.01)
*H05K 9/00* (2006.01)

(52) U.S. Cl.
CPC ............. *H02B 1/202* (2013.01); *H02B 3/00* (2013.01); *H05K 9/0007* (2013.01)

(58) Field of Classification Search
None
See application file for complete search history.

(56) References Cited

U.S. PATENT DOCUMENTS 4,015,070 A * 3/1977 Theurer ................. H05K 9/006
  174/535
4,384,906 A * 5/1983 Molinari ............ H02G 15/1813
  156/86

(Continued)

FOREIGN PATENT DOCUMENTS

DE      199 36 508 C2    4/2002
DE  10 2005 033 910 B4    9/2014

(Continued)

*Primary Examiner* — Timothy J. Dole
*Assistant Examiner* — Muhammed Azam
(74) *Attorney, Agent, or Firm* — Joseph V. Saphia; Haug Partners LLP (57) ABSTRACT

A method for reducing a volume of air within an electrical distribution system. The method includes providing at least one cable, surrounding the at least one cable with an isolating unit, placing a first shielding body on a top surface of the isolating unit, placing a second shielding body on a bottom surface of the isolating unit, wherein placing the first shielding body and the second shielding body creates a gap X1 between the first shielding body or the second shielding body and the isolating unit, and crimping the first shielding body to the second shielding body to create a shield housing, so that a gap X2 is created between the first shielding body or the second shielding body and the isolating unit, wherein X2 is less than X1. The at least a portion of the first shielding body may overlap with the second shielding body, and the first shielding body or the second shielding body may include at least one flared portion. The overlap may occur at a location corresponding to the flared portion, with the flared portion having a length N, wherein N may be equal to about 2(X1–X2). Gaps X1 and X2 may be air gaps.

13 Claims, 7 Drawing Sheets

(56) References Cited

U.S. PATENT DOCUMENTS

| | | | | |
|---|---|---|---|---|
| 4,478,252 | A | * | 10/1984 | McLoughlin ........... B29C 61/10 138/140 |
| 4,567,318 | A | * | 1/1986 | Shu ........................ H05K 9/006 174/372 |
| 4,959,504 | A | * | 9/1990 | Yarger ................. H05K 9/0001 174/386 |
| 5,000,228 | A | * | 3/1991 | Manent .................... D04C 1/06 138/110 |
| 6,265,665 | B1 | * | 7/2001 | Zahnen .................... H01R 4/70 174/70 A |
| 6,639,146 | B1 | * | 10/2003 | Chiu .................... H02G 3/0666 174/359 |
| 7,048,586 | B2 | * | 5/2006 | Ishizaki .................... H01R 9/05 439/108 |
| 7,057,104 | B1 | * | 6/2006 | McCleskey ............. H02G 3/06 174/24 |
| 7,753,734 | B2 | * | 7/2010 | Eckel ................ H01R 13/6593 439/584 |
| 7,893,354 | B2 | * | 2/2011 | Albert ................ B60R 16/0222 174/72 A |
| 9,373,943 | B1 | * | 6/2016 | Tannenbaum ....... H02G 3/0437 |
| 9,954,320 | B1 | * | 4/2018 | Hassan ................ H01B 7/1875 |
| 2003/0042032 | A1 | * | 3/2003 | Syed ................... H05K 9/0018 174/36 |
| 2004/0206542 | A1 | * | 10/2004 | Gladd ................... H01R 9/0524 174/78 |
| 2007/0137881 | A1 | * | 6/2007 | Ashibe ................... H02G 15/34 174/125.1 |
| 2009/0057003 | A1 | * | 3/2009 | Crotty, Jr. ............. H05K 9/0032 174/372 |
| 2009/0060419 | A1 | * | 3/2009 | Lu ........................ H02G 15/113 385/56 |
| 2010/0190389 | A1 | * | 7/2010 | DeFrance ............. H02G 15/08 439/877 |
| 2011/0250774 | A1 | * | 10/2011 | Raad ....................... H01R 13/53 439/271 |
| 2011/0297442 | A1 | * | 12/2011 | Sulzer ...................... F16L 5/10 174/88 R |
| 2013/0075149 | A1 | * | 3/2013 | Golko .................. H01R 13/516 174/359 |
| 2013/0118800 | A1 | * | 5/2013 | Toyama ............... B60R 16/0215 174/72 A |
| 2013/0199836 | A1 | * | 8/2013 | Adachi .................. H05K 9/002 174/384 |
| 2014/0008119 | A1 | * | 1/2014 | Brandt ................. H05K 9/0073 174/382 |
| 2014/0238735 | A1 | * | 8/2014 | Adachi .................... H01R 4/20 174/351 |
| 2014/0248024 | A1 | * | 9/2014 | Kimbrell ............. G02B 6/4427 385/100 |
| 2015/0114711 | A1 | * | 4/2015 | Dew ...................... H01B 7/0045 174/72 A |
| 2015/0144394 | A1 | * | 5/2015 | Webb .................... H02G 15/113 174/658 |
| 2015/0176162 | A1 | * | 6/2015 | Relats Manent ...... D04B 21/16 66/195 |
| 2015/0215994 | A1 | * | 7/2015 | Bohlender ............. B32B 37/18 219/540 |
| 2016/0133355 | A1 | * | 5/2016 | Glew ...................... H01B 3/30 248/49 |
| 2016/0134096 | A1 | * | 5/2016 | Kett .................... H02G 3/0666 174/360 |
| 2016/0261098 | A1 | * | 9/2016 | Grant ..................... H02G 3/081 |
| 2016/0286697 | A1 | * | 9/2016 | Degen ................... H01R 31/02 |
| 2017/0181337 | A1 | * | 6/2017 | Itani ..................... H02G 3/0462 |
| 2017/0202093 | A1 | * | 7/2017 | Bang ........................ H05K 1/18 |
| 2017/0324231 | A1 | * | 11/2017 | Mizutani .................. H02G 3/06 |
| 2017/0358874 | A1 | * | 12/2017 | Albert ................ H01R 13/6596 |
| 2018/0054114 | A1 | * | 2/2018 | Wu ....................... H05K 9/0007 |
| 2018/0064003 | A1 | * | 3/2018 | Suetani ................. H05K 9/0098 |
| 2018/0131172 | A1 | * | 5/2018 | Kumar .................. H02G 15/1833 |
| 2018/0174718 | A1 | * | 6/2018 | Sugino ................. H01B 17/583 |
| 2018/0219368 | A1 | * | 8/2018 | Kutsch ................. H02G 15/013 |
| 2018/0231595 | A1 | * | 8/2018 | Wangemann ........... G01R 31/50 |
| 2019/0237949 | A1 | * | 8/2019 | Culhane ............... H02B 13/0358 |
| 2019/0319437 | A1 | * | 10/2019 | Chu ....................... F16L 33/035 |
| 2019/0363522 | A1 | * | 11/2019 | Perez-Lazcano ........ H02B 3/00 |

FOREIGN PATENT DOCUMENTS

| | | |
|---|---|---|
| DE | 10 2013 016 099 A1 | 4/2015 |
| EP | 2 945 238 A1 | 11/2015 |

* cited by examiner

SYSTEM AND METHOD FOR REDUCING AIR VOLUME IN A SPLITTER

RELATED APPLICATION

This application claims the benefit of U.S. Provisional Application No. 62/676,415, filed May 25, 2018, which is incorporated herein by reference.

FIELD OF THE INVENTION

This disclosure relates generally to systems and methods for reducing air volume in a sealed housing. In particular, this disclosure relates to an electrical isolator and method of crimping a shield housing for reducing an air volume and moisture within an electrical distribution housings.

BACKGROUND OF THE INVENTION

Electrical distribution housings (e.g., splitters, y-distributors, etc.) are subject to temperature fluctuations due to environmental changes as well as heat dissipation from the wires that they house. Because electrical distribution housings are sealed housing, air that is trapped within the housing will expand and contract in response to these temperature changes. Thus, the temperature fluctuations cause pressure fluctuations.

Pressure changes that are experienced within electrical distribution housings causes wear and tear on the sealing elements as well as exacerbating degradation of electrical components from moisture in the air. Moreover, peak pressure values due to sudden thermal expansion of air put a high degree of strain on sealing members. For example, when an electrical distribution housing is mounted in an engine compartment of an automobile the ambient heat generated by the engine may rise to about 100° C., thereby raising the temperature of the electrical distribution housing to 100° C. However, sudden changes in the engine compartment (e.g., the introduction of rain water, cleaning solutions, cold air, etc.) may drastically and suddenly decrease the temperature of the electrical distribution housing. Such sudden changes in temperature cause peak pressure changes, which severely degrade sealing members of the electrical distribution housing.

Conventional electrical distribution housings are known to incorporate venting membranes and/or pressure equalization elements to help address this problem. But venting membranes and/or pressure equalization elements are typically expensive to manufacture and difficult to implement. Moreover, using a pressure exchange element changes the pollution degree of electrical distribution housings, which effects applicable safety standards. For example, according to the International Electrotechnical Commision's ("IEC") standards (i.e., IEC 60664-1), pollution degree three may be defined as conductive pollution or dry nonconductive pollution that becomes conductive due to condensation, while pollution degree two may be defined as nonconductive pollution with temporary conductivity caused by condensation. Implementing a pressure exchange element in a housing raises the pollution degree to three because conductive pollution due to condensation cannot be protected against with such an exchanger. At higher pollution degrees greater creepage and clearance distances are required (e.g., according to IEC standards) in order to ensure that the device is safe and non-hazardous. Moreover, a pressure exchange element is a weak link in a sealed housing because such an element includes a specialized membrane that lets air (and water vapor) pass therethrough. Through the natural surface tension of water and the very small openings in the membrane, water is kept out. Nevertheless, in the case of submerging into a liquid and pressure changes inside the housing, water may pass through the pressure exchange element.

Alternative means for reducing pressure fluctuations within a housing include reducing the ambient volume, which reduces the amount of air (and moisture). It is known in the art to overmold wiring and perform potting (e.g., filling an electronic device with a solid or viscous substance) in order to reduce the available gas volume within an electronic device. But performing overmolding and/or potting requires additional manufacturing steps, which increase costs. Additionally, overmolding and/or potting are not easily accomplished in serial processing where a combination of different materials are used. Another option could be to displace the air with a plastic granulate or powder. But this also requires additional manufacturing steps and is not easily accomplished in serial processing.

Prior art electrical distribution housings do not contemplate other means for reducing the air volume within a sealed housing. There remains a need for alternative means to reduce the air volume, and thus reduce pressure fluctuations, which is simpler, more cost effective, and maintains a lower pollution degree.

SUMMARY OF THE INVENTION

Various illustrative embodiments of the present disclosure provide an electrical distribution system and related methods. In accordance with one aspect of an illustrative embodiment of the present disclosure, the electrical distribution system may include a plurality of cables, an isolator, a body closure, and a shield housing.

The isolator may be an electrical isolator configured to displace air within the electrical distribution housing. The electrical isolator may include a isolator cover and an isolator body. The electrical isolator may have a size and shape similar to, but slightly smaller than the shield housing.

The body closure may include a one-way body part and a two-way body part. The one-way body part may be attached to the two-way body part to form the body closure. The body enclosure may house the isolator, the shield housing, and portions of the plurality of cables.

The one-way body part may have a generally tubular shape with an input end and an output end. The output end may have a width that is greater than the width of the input end. The input end may include at least one end-cap guiding element that can align with an end cap. The output end may include at least one body-closure fastening element that can attach to a corresponding body-closure fastening element on the two-way body part.

The two-way body part includes an input end and an output end, and may include a first portion and a second portion. The first portion and the second portion may each have a generally tubular shape and include an input end and an output end. The first portion and the second portion may be offset by an angle α. The output end of the first portion and the second portion may each include at least one end-cap guiding element that can align with an end cap. The input end of the two-way body part may include at least one body-closure fastening element that can attach to a corresponding body-closure fastening element on the one-way body part.

The shielding housing may include two shielding bodies. The two shielding bodies may be affixed to the plurality of cables with a plurality of crimping elements (e.g., ferrules). Once affixed, the two shielding bodies may encase or encircle the isolator and portions of the plurality of cables such that the shielding bodies are located between the isolator and the body closure.

BRIEF DESCRIPTION OF THE DRAWINGS

The following description, given by way of example and not intended to limit the invention to the disclosed details, is made in conjunction with the accompanying drawings, in which like references denote like or similar elements and parts, and in which.

DETAILED DESCRIPTION

Detailed embodiments of the present electrical distribution system, and methods are disclosed herein; however, it is to be understood that the disclosed embodiments are merely illustrative of the y electrical distribution system, and methods that may be embodied in various forms. In addition, each of the examples given in connection with the various embodiments of the systems and methods are intended to be illustrative, and not restrictive. Further, the drawings and photographs are not necessarily to scale, and some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present electrical distribution system, and methods.

Figure 1:
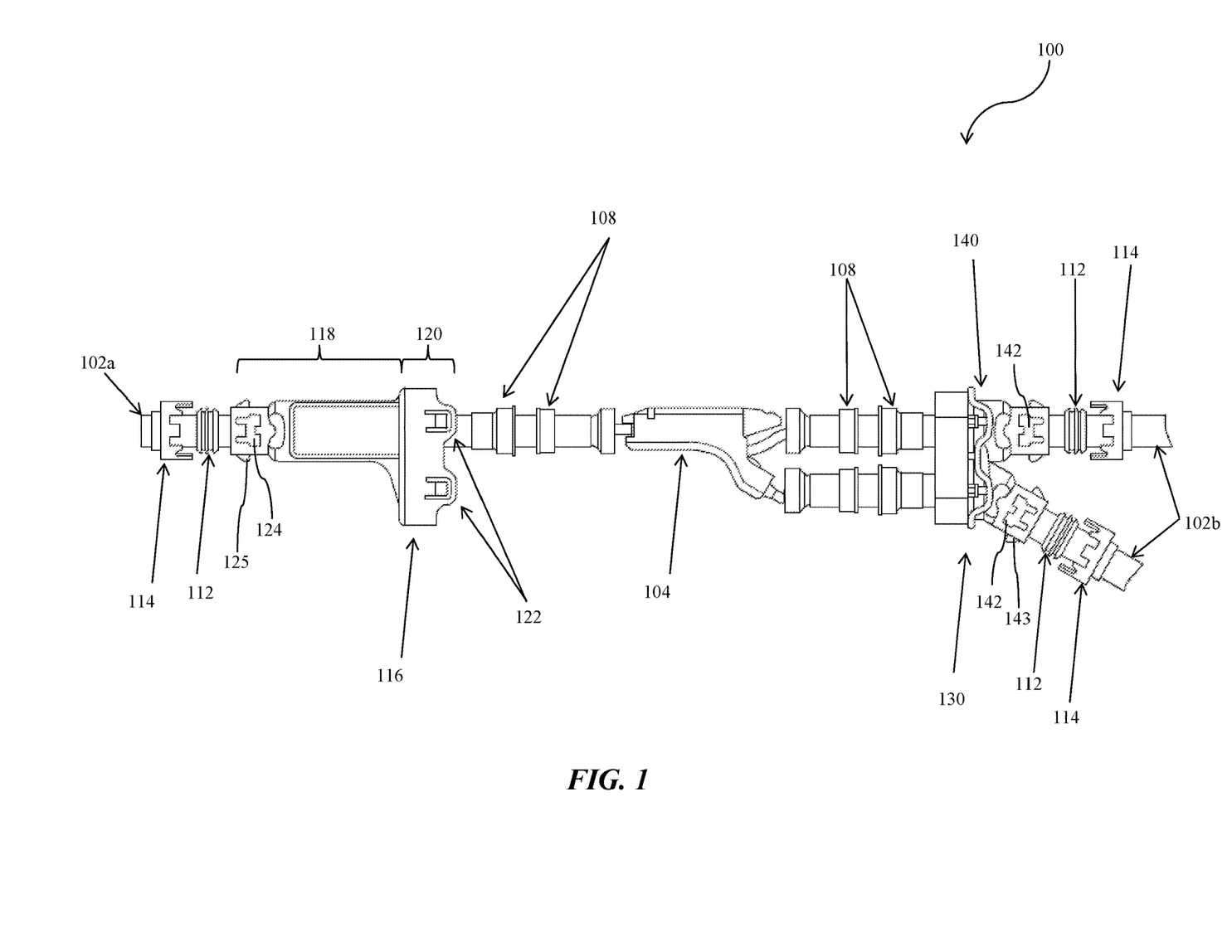
FIG. 1 is an exploded view of an embodiment of the electrical distribution system of the present disclosure.
Figure 2:
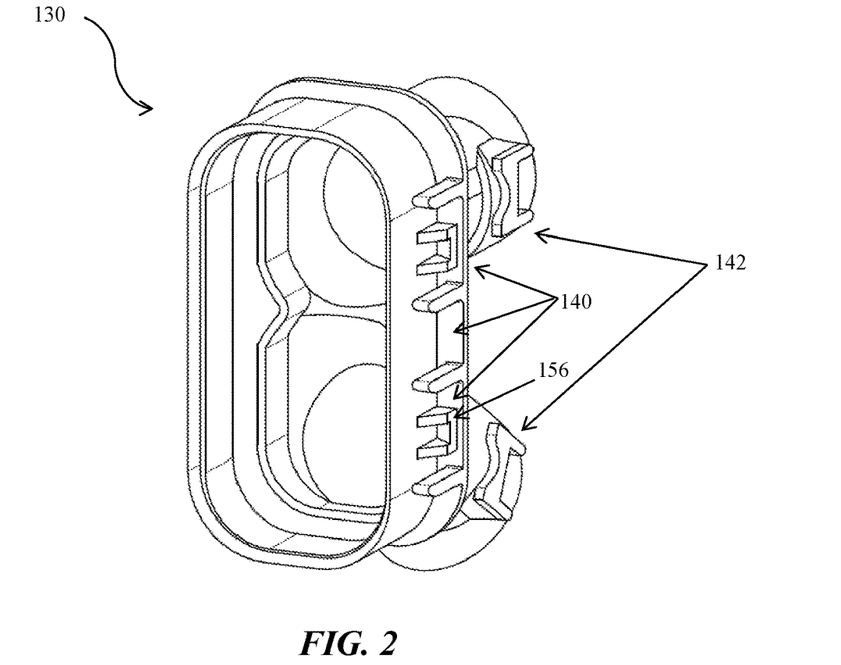
FIG. 2 is a perspective view of an embodiment of a two-way body part of a electrical distribution system of the present disclosure.

With reference to FIG. 1, an embodiment of the electrical distribution system 100 of the present disclosure is illustrated. The electrical distribution system may take the form of a y-distributor 100. The y-distributor may include a plurality of cables 102, an isolator 104, and a body closure 110. The illustrative embodiment of FIG. 1 is non-limiting and electrical distribution systems within the scope of this disclosure may be modified. The below disclosure makes reference to a y-distributor 100. However, aspects and components of present disclosure are equally applicable to different types of electrical distribution systems and sealed housings (e.g., three-way splitters, four-way splitters, etc.), which are within the scope of the present disclosure.

According to an embodiment, each cable 102 may be associated with a cable seal 112. As further discussed below, cable seals 112 may be press-fit into a space between each cable 102 and a corresponding input (or output) end of the one-way body part and the two-way body part (See FIG. 10). Such a configuration serves to seal portions of each cable 102 within the y-distributor 100. Each cable 102 includes at least one core/conductor (e.g., may be a single conductor or multi-conductor cable).

According to an embodiment, an isolator 104 is located within the y-distributor 100 where an input cable 102a splits into two output cables 102b. The isolator 104 is configured to ensure electrical isolation of wires of the input cable 102a and wires of the output cables 102b. The isolator 104 may also serve to reduce the total air volume and moisture within the y-distributor 100. As illustrated in FIG. 1, isolator 104 may generally have the same shape as the body closure 110, but with reduced dimension.

Figure 9:
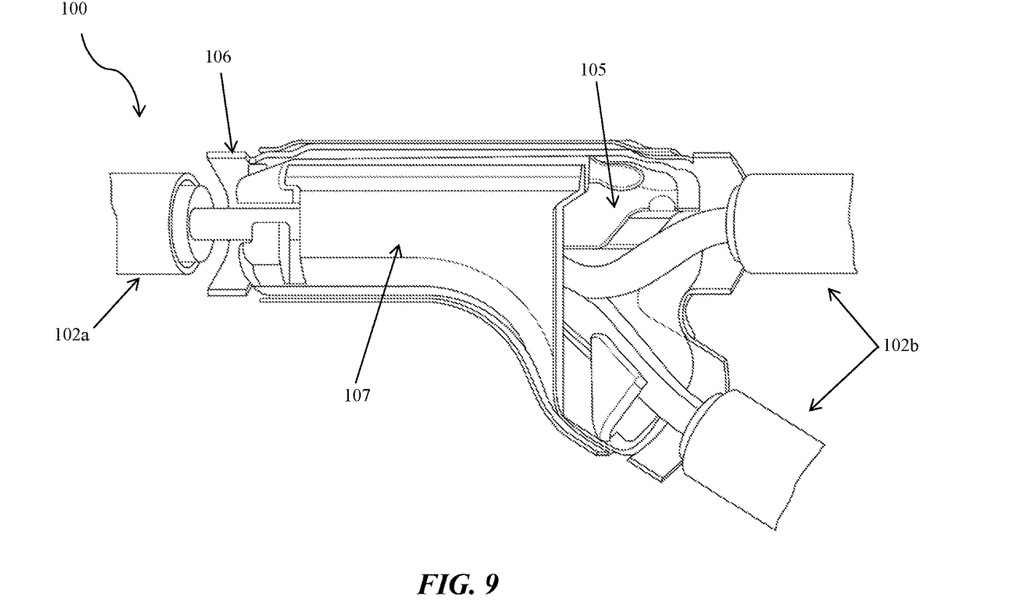
FIG. 9 illustrates a magnified cut-away view of components of the electrical distribution system of the present disclosure.
Figure 10:
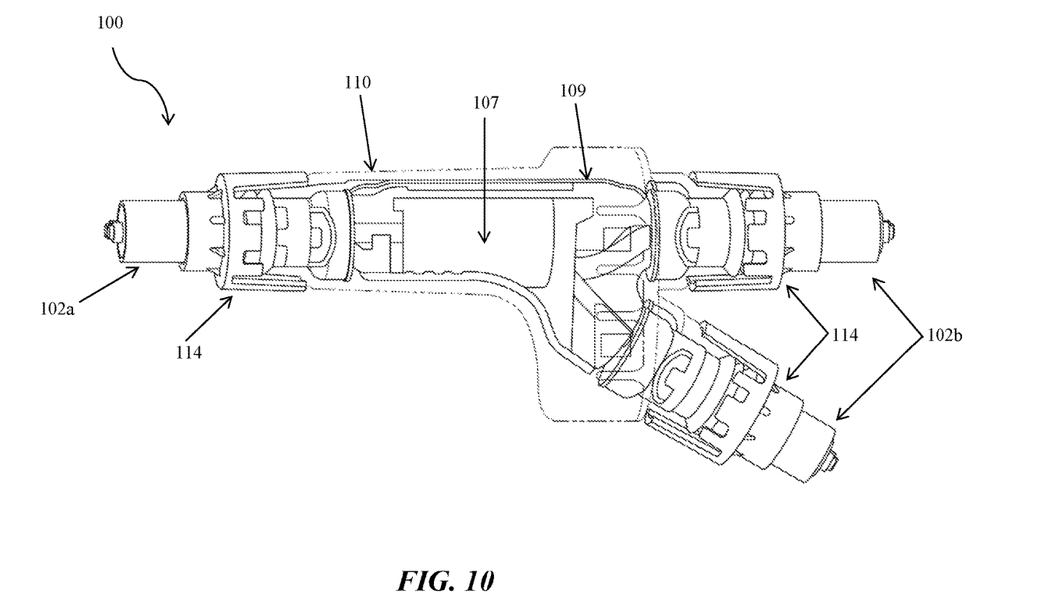
FIG. 10 illustrates a magnified view of the electrical distribution system in its assembled form of the present disclosure.

According to an embodiment, isolator 104 may be an electrical isolator configured to displace gasses (e.g., air) within the y-distributor 100. The electrical isolator may include a isolator cover 105 and an isolator body 107. As illustrated by FIGS. 9 and 10, the electrical isolator may have a size and shape similar to, but slightly smaller than the internal dimensions of shield housing 109. Isolator cover 105 may be generally located within a portion of isolator body 107 and attached thereto, for example, utilizing clip-in features. Isolator cover 105 may be attached to isolator body 107 after the cables 102 have been inserted into isolator body 107. As illustrated by FIG. 9, isolator cover 105 has a top surface with a shape that conforms to the shape of shield housing 109. By making the size and shape of isolator 104 nearly the same as the internal dimensions of shield housing 109 the amount of air within the y-distributor 100 kept to a minimum. Isolator 104 includes at least one bore through its center to accommodate the wires of cables 102. As illustrated by FIG. 9, the shape of isolator cover 105 and isolator body 107 is configured to allow the wires of cables 102b to route in different directions.

Since the amount of air within y-distributor 100 is kept to a minimum, pressure fluctuations due to the expansion of air are greatly reduced. Isolator 104 may also include ribs and/or grooves to maintain a constant wall thickness, while still displacing a large volume of air within y-distributor 100. For example, according to an embodiment, isolator cover 105 and isolator body 107 include complementary shaped ribs and grooves that interconnect, thus increasing the overall thickness of isolator 104 without increasing the wall thickness of isolator cover 105 and isolator body 107. By ensuring that each of isolator cover 105 and isolator body 107 include a constant wall thickness, manufacturing difficulties are reduced (e.g., during plastic molding a constant wall thickness promotes even cooling). By increasing the volume of isolator 104 the amount of volume that is displaced within y-distributor 100 is increased, further reducing the amount of air, and thus further reducing pressure fluctuations. Any remaining pressure fluctuations may be dissipated by the structure and material of cables 102, which can support a minimal air-flow rate. By reducing the amount of air within y-distributor 100 and avoiding the use of a venting membrane or pressure equalization element the isolator 104 of the present disclosure allows the pollution degree to be kept low (e.g., pollution degree two). With a lower pollution degree, creepage and clearance distances may been kept to a minimum (e.g., according to IEC standards), thereby advantageously reducing the overall dimensions of the y-distributor 100.

According to embodiments, isolator 104 may be made from a plastic. According to a preferred embodiment, isolator may be made from a thermoplastic. According to a more preferred embodiment, isolator 104 may be made from polybutylene terephthalate with glass fiber reinforcement ("PBT-GF"). PBT-GF advantageously provides improved electrical insulation and resistance to shrinking. Additionally, thermal expansion of plastics, and in particular thermoplastics of the present disclosure, is much lower as comparison to air.

Isolator 104 reduces the amount of air (and moisture) within y-distributor 100, which reduces pressure fluctuations felt within the y-distributor. This helps maintain the integrity of the seals created by cable seals 112.

Although isolator 104 is discussed as being used with a y-distributor, the present disclosure is not meant to be so limited. Isolator 104 may be sized and shaped to fit within varying types of electrical distribution housings. For example, isolator 104 may be sized and shaped to fit with a housing of a conventional three-way splitter. In such a configuration, isolator 104 similarly provides the benefit of reducing the amount of air within the three-way splitter, which in turn helps to ensure that the housing remains sealed. Isolator 104 may also be used in any other type of housing that must be sealed and where it is advantageous to omit venting membranes and/or pressure equalization elements.

According to an embodiment, shield housing 109 may include two shielding bodies 106. Shielding bodies 106 may be affixed to the plurality of cables 102 utilizing a plurality of crimping elements (e.g., ferrules 108) (see, e.g., FIGS. 1 and 8), creating shielding housing 109. Once affixed, the two shielding bodies may encase or encircle the isolator 104 and portions of the plurality of cables 102 such that the shielding bodies are located between the isolator 104 and the body closure 110 (see, e.g., FIGS. 8-11B). The shielding bodies 106, once crimped to the cables 102, provide a first means to divert one of the cables 102b in a desired direction (e.g., at an angle relative to the other cables 102).

Figure 11A:
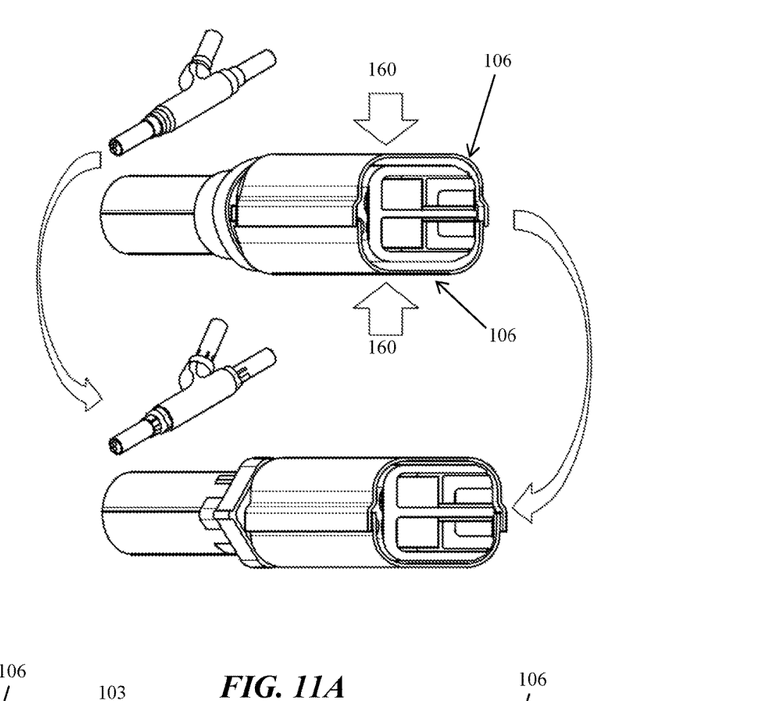
FIG. 11A illustrates a cross-sectional view through a portion of the electrical distribution system of the present disclosure in a non-crimped and crimped state.
Figures 11B, 11C:
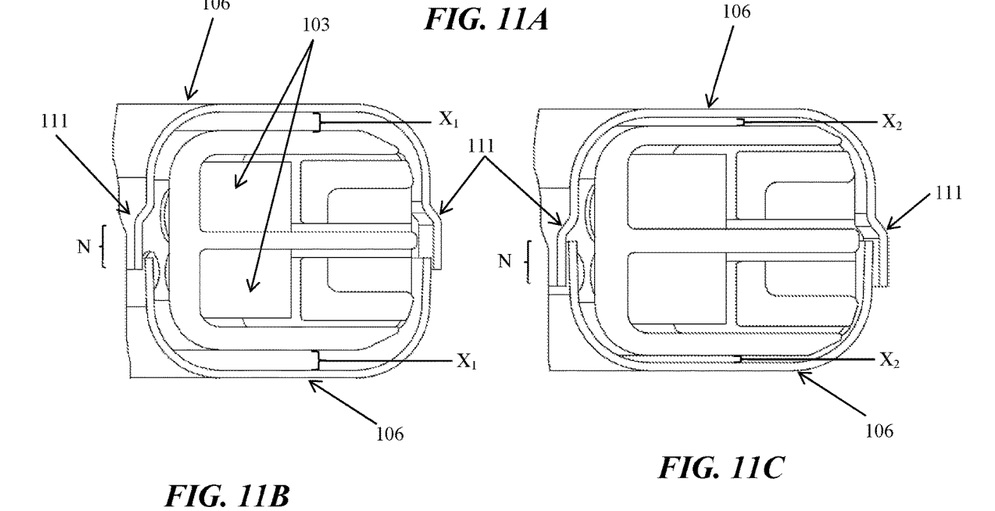
FIGS. 11B and 11C illustrates a magnified cross-sectional view through a portion of the electrical distribution system of the present disclosure in a non-crimped and crimped state.

According to an embodiment, the crimping process is carried out in such a way as to displace shielding bodies 106 to be as close as possible to the rest of the internal parts (e.g., isolator 104, cables 102, etc.) of y-distributor 100. As illustrated by FIGS. 9 and 11A, two shielding bodies 106 are configured to surround isolator 104 and portions of cables 102. Shielding bodies may have a "U" shaped cross-section. One of the shielding bodies may include a flared portion 111 with a length "N", which allows the shielding bodies to overlap in a pre-crimped state (See FIG. 11B).

In a pre-crimped state the shielding bodies 106 are separate from isolator 104 by a distance $X_1$. Through crimping, as illustrated by arrows 160, shielding bodies 106 are displaced toward each other a distance corresponding to length "N" so that the shielding bodies 106 are separate from isolator 104 by a distance $X_2$, which is less than $X_1$ (e.g., $N=2(X_1-X_2)$. The reduction of the distance between the shielding bodies 106 and isolator 104 from $X_1$ to $X_2$ functions to reduce the air volume within y-distributor by ensuring that ambient space between the shield housing 109 and isolator 104 is at a minimum. According to an embodiment, shield housing 109 and body closure 110 are sized and shaped such that shield housing 109 cannot fit within body closure 110 until the crimping process has been completed (i.e., shielding plates 106 are separated from the internal components by distance $X_2$). This guarantees that the crimping process is carried out.

By reducing the amount of air within y-distributor 100 and avoiding the use of a venting membrane or pressure equalization element the crimping process of the present disclosure allows the pollution degree to be kept low (e.g., pollution degree two). As discussed above, with a lower pollution degree, creepage and clearance distances may been kept to a minimum (e.g., according to IEC standards), thereby advantageously reducing the overall dimensions of the y-distributor 100.

Figure 8:
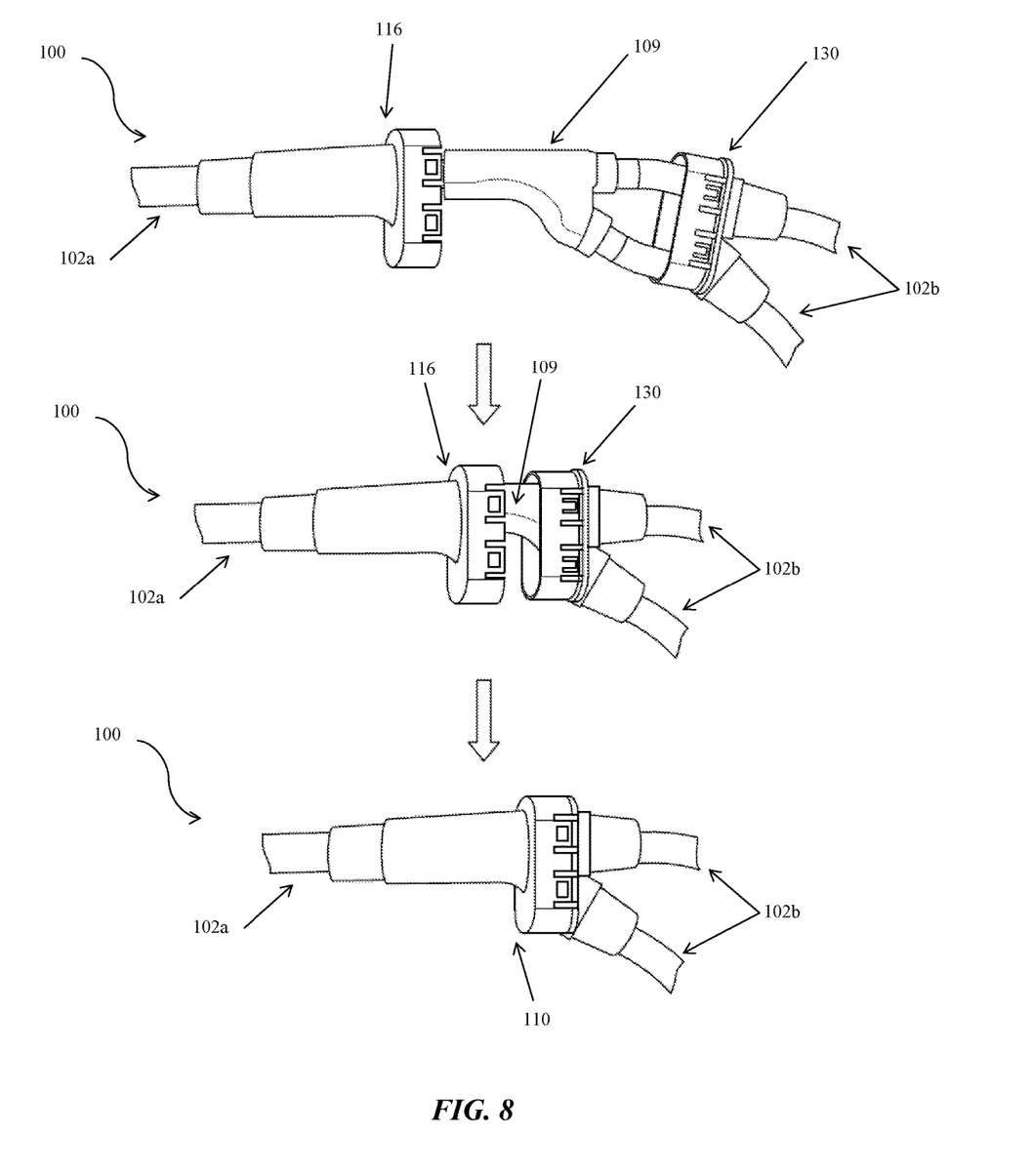
FIG. 8 illustrates a method of assembling a body closure of an embodiment of a y electrical distribution system of the present disclosure.

According to an embodiment, the body closure 110 may include a one-way body part 116 and a two-way body part 130. The one-way body part 116 may be attached to the two-way body part 130 to form the body closure 110. As illustrated in FIGS. 1 and 8, the body enclosure 110 may house the isolator 104, the two shielding plate 106 (and associated crimp ferrules) and portions of the plurality of cables 102.

As illustrated by the embodiment shown in FIG. 1, the one-way body part 116 may have a generally tubular shape with an input end 118 and an output end 120. The input end 118 may include at least one end-cap fastening element 124 that can attach to an end cap 114. As described in further detail below, the size and shape of end-cap fastening element 124 ensures that one-way body part 116 can be securely fastened to an end cap 114.

The output end 120 may have a width that is greater than the width of the input end. The output end 120 is also shaped to conform to and fit over the input end 132 of the two-way body part 130. The output end 120 may include at least one body-closure fastening element 122 that can attach to a corresponding body-closure fastening element 140 on the two-way body part 130.

According to an embodiment, two body-closure fastening elements 122 are located each side of output end 120, while two body-closure fastening elements 140 are located each side of input end 132. As described in further detail below, the size and shape of body-closure fastening elements 122, 140 ensures that one-way body part 116 and two-way body part 130 can be securely fastened to each other.

Although the embodiments and figures described in the present disclosure include four body-closure fastening elements 122 and four body-closure fastening elements 140, varying numbers of body-closure fastening elements are within the scope of this disclosure. For example, each side of output end 120 and input end 132 may include one or three corresponding body-closure fastening elements. According to alternative embodiments, a varying numbers of body-closure fastening elements may be located only on one side of output end 120 and input end 132.

Input end 118 has a generally tubular shape with an internal bore. The internal diameter of input end 118 is configured to accommodate input cable 102a. According to a preferred embodiment, the internal diameter of input end 118 is slightly larger than the outer diameter of input cable 102a. In such a configuration, one-way body part can easily slide over and long input cable 102a while also allowing the cable seal 112 to seal the space therebetween.

Output end 120, as illustrated in FIGS. 1 and 8, flares outward and is shaped to conform to the shape of input end 132 of the two-way body part 130. Protrusions at the forward-most end of output end 120 include body-closure fastening elements 122, as described above.

According to an embodiment, the two-way body part 130 includes an input end 132 and an output end 134. The output end 134 may include a first portion 136 and a second portion 138. The first portion and the second portion may each have a generally tubular shape and include an input end 144, 148 and an output end 146,150. The first portion and the second portion may be offset by an angle α. The output end of the first portion 146 and the output end second portion 150 may each include at least one end-cap guiding element 142 configured to guide an end cap 114. The input end 132 of the two-way body part 130 may include at least one body-closure fastening element 140 that can attach to a corresponding body-closure fastening element 122 on the one-way body part 116.

Figure 3:
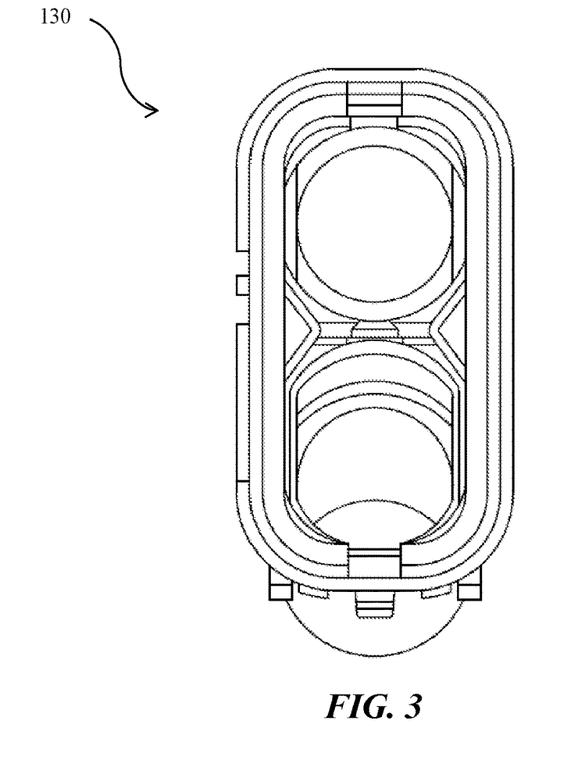
FIG. 3 is a front view of an embodiment of a two-way body part of a electrical distribution system of the present disclosure.

As illustrated in FIGS. 1 and 8, first portion 136 is generally collinear and parallel with input end 118 of one-way body part 116. On the other hand, second portion 138 is non-parallel with and offset from first portion 136 by an angled a. According to a preferred embodiment, and as illustrated by FIG. 3, the centerline of second portion 138 is offset by angle α from the centerline of first portion 136.

According to embodiments of the disclosure, a may range from approximately 5°-60°. According to preferred embodiments, a may range from approximately 25°-45°. The value of a may be selected according to desired implementations of the y-distributor of the present disclosure. For example, a may be selected based upon where the y-distributor is to be located in relation to the electrical units that it is to be connected to, taking into consideration the diameter of the cables that are to be used and their allowed radius of curvature. As can be seen from FIGS. 1, 4, 5, and 8, the value of a effects the geometry of output cables 102b. By controlling the output angle of cable 102b through second portion 138, the y-distributor of the present disclosure beneficially routes cables in a desired direction as they exit the y-distributor. By routing a cable as it exits the y-distributor, bending requirements for the cable are reduced, advantageously resulting in the ability to accommodate for bending radius restrictions at the outset. This further reduces the amount wiring needed, as less cable bending occurs.

FIGS. 2-7 illustrate an embodiment of the two-way body part 130 of the y-distributor 100 of the present disclosure. Input end 132 of two-way body part 130 is generally ovular in shape with a central bore while output end 134 includes first portion 136 and second portion 138. Input end 132 is shaped to fit within output end 120 of one-way body part 116 such that body-closure fastening elements 122 engage with body-closure fastening elements 140.

As generally described above, first portion 136 and second portion 138 are each generally tubular and include a central bore. The central bore of the first portion 136 and second portion 138 may have approximately the same diameter, such that the internal diameter of the first portion 136 and second portion 138 are approximately equal. According to alternative embodiment, the internal diameter of the first portion 136 and the second portion 138 may be different.

Figure 4A:
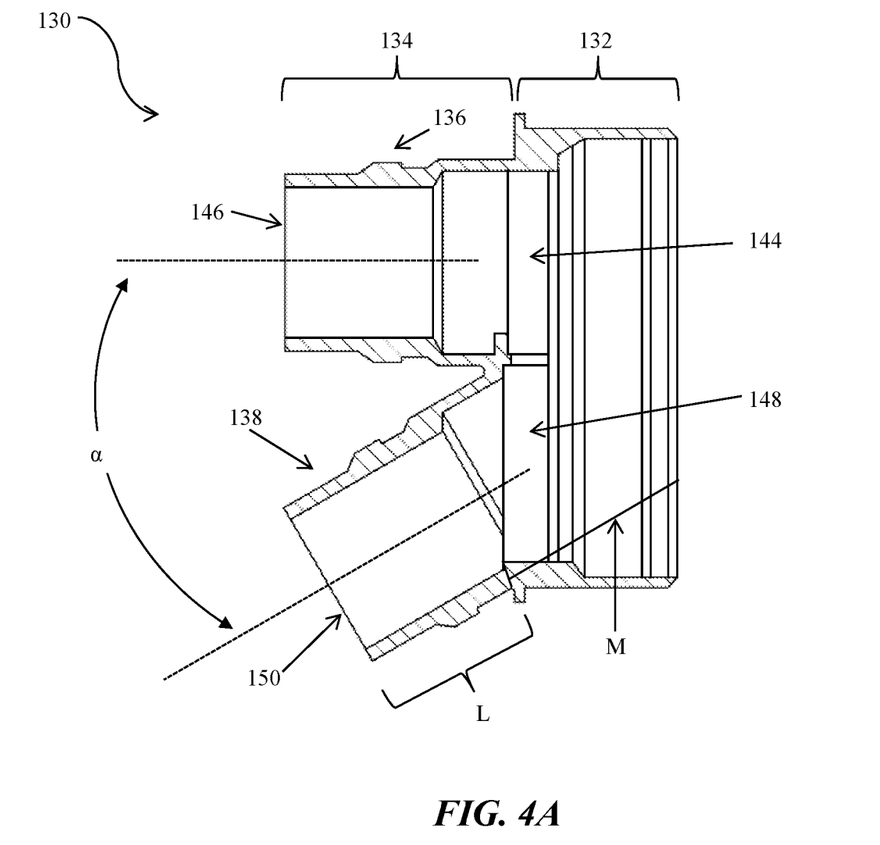
FIG. 4A is a cross-sectional side view of an embodiment of a two-way body part of a electrical distribution system of the present disclosure.
Figure 4B:
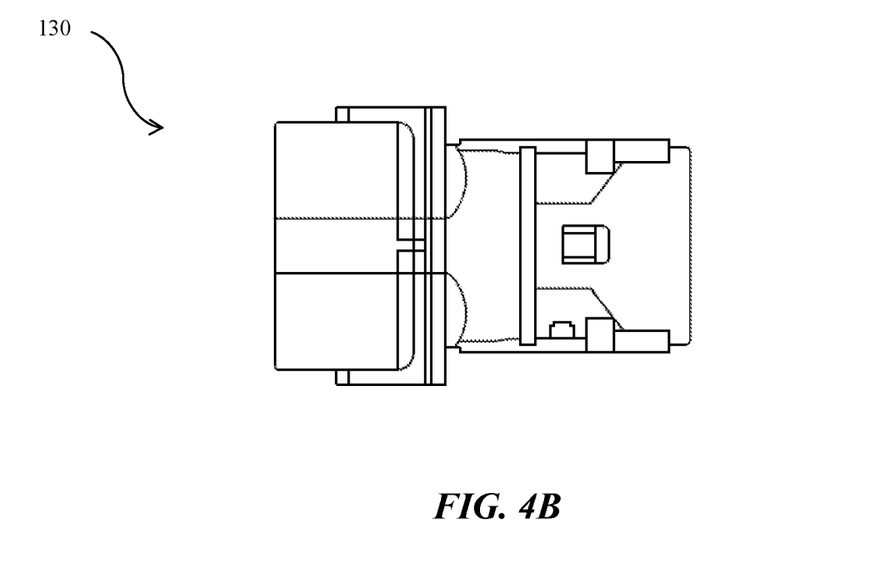
FIG. 4B is a top view of an embodiment of a two-way body part of a electrical distribution system of the present disclosure.
Figure 5:
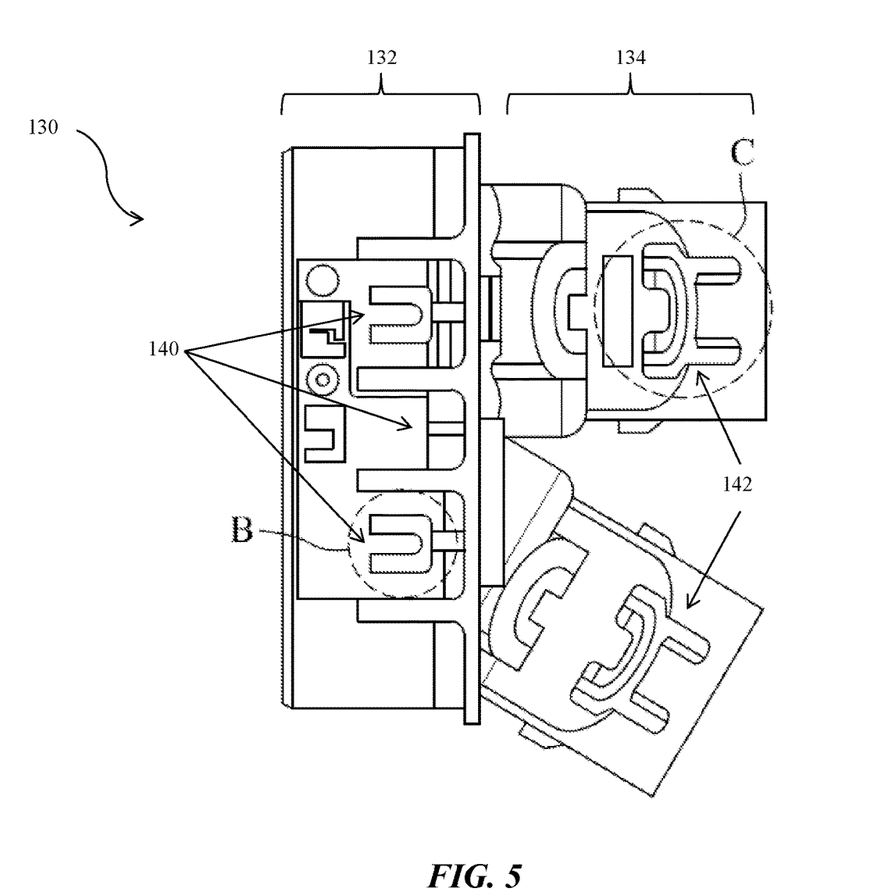
FIG. 5 is a side view of an embodiment of a two-way body part of electrical distribution system of the present disclosure.
Figure 6:
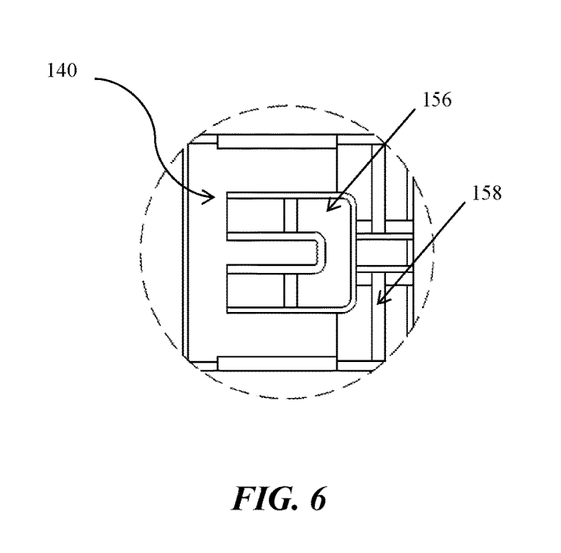
FIG. 6 is a magnified view of region B illustrated in FIG. 5 of the present disclosure.
Figure 7:
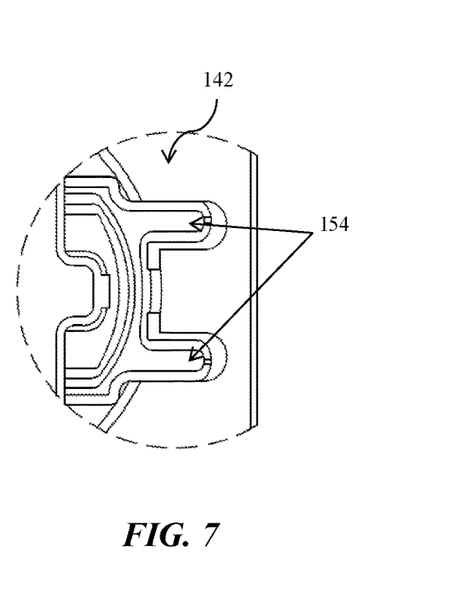
FIG. 7 is a magnified view of region C illustrated in FIG. 5 of the present disclosure.

Second portion 138 has a length "L" that extends from input 148 to output 150. Measurement "M" is the distance, measured along a line parallel to length "L," from the junction where input end 132 and output end 134 meet to the distal end of input end 132, as illustrated in FIG. 4A. According to an embodiment, a ratio of "L" to "M" is approximately 1:1. According to alternative embodiments, the ratio of L to M may vary depending upon, for example, angle α, the length and diameter of cable 102, etc.

Such a ratio advantageously provides the benefit of allowing cable 102b to easily pass through second portion 138 and bend according to angle α with ease while also accommodating the bending radius restriction of cable 102 (e.g., 3xd). For example, it has been found that if length "L" and measurement "M" do not conform to the above ratio(s) it becomes difficult to route/mount cable 102b within two-way body part 130. This is at least partially due to the fact that cable 102b would need to over bend at the junction between input end 132 and output end 134 in order to be routed through second portion 138. This would prevent two-way body part 130 from easily sliding over cable 102b, thereby impeding the mating of two-way body part 130 with one-way body part 116 as well as and angling cables 102b. Without the ability to slide easily, cable 102 may be damaged during assembly of the distributor as well.

As discussed above, two-way body part 130 includes at least one end-cap guiding element 142 on each of first part 136 and second part 138. According to an embodiment, and as illustrated in FIGS. 1, 2, 5, and 7, end-cap guiding element 142 is generally "U" shaped with a pair of legs 154 extending towards output end 146, 150. End caps 114 include a shape that is complementary to the shape of end-cap guiding element 142 so that the end caps 114 are properly aligned with the end-cap guiding elements 142. Upon alignment, lugs on the side of the end-cap 114 attach to (e.g., snap onto) projections 143, mating the end caps to the two-way body part 130. End-cap fastening guiding 124 may take the same general shape and form of end-cap guiding elements 142, while projections 125 may also take the same general shape and form of projections 143. In this way, the end caps 114 in conjunction with cable seals 112 ensure that the ends of y-distributor 100 are sealed around cables 102. The exact shape and dimensions of end-cap guiding elements 142, 124, projections 125, 143, and end caps 114 may vary and alternative shapes and configurations are within the scope of the present disclosure.

As further discussed above, two-way body part 130 includes at least one body-closure fastening element 140 on input end 132. According to an embodiment, and as illustrated in FIGS. 1, 2, 5, and 6, at least one body-closure fastening element 140 includes a generally "Y" shaped projection 156 and an indentation 158, while at least one other portion omits a portion of the Y-shaped projection. One-way body part 116 includes at least one body-closure fastening element 122 on output end 120. At least one body-closure fastening element 122 includes a generally square-shaped ring 123. At least one other portion includes a generally square-shaped element. As seen in FIG. 8, square-shaped ring 123 is configured to slide over projection 156 so and rest at least partially within indentation 158. Once in place, projection 156 prevents the square-shaped ring 123 exiting indentation 158, thus locking one-way body part 116 to two-way body part 130. The exact shape and dimensions of body-closure fastening element 140 and body-closure fastening element 122 may vary and alternative shapes and configurations are within the scope of the present disclosure.

Methods of assembling the y-shaped distributor 100 of the present disclosure will now be described. According to an embodiment, a method of assembling the y-shaped distributor 100 includes connecting input cable 102a to output cables 102b. Methods of splitting input cable 102a into output cables 102b are generally known in the art (e.g., by welding or crimping), and are therefor omitted from this disclosure. Wires of input cable 102a and output cables 102b are further routed through isolator 104, as illustrated by FIGS. 1, 9, and 10.

Subsequent (or prior) to connecting input cable 102a to output cables 102b crimp ferrules 108 are slid onto the cables 102 and shielding bodies 106 are aligned over isolator 104 and portions of the cables 102. Using the crimp ferrules 108 (or other suitable crimping elements), shielding bodies 106 are crimped to cables 102, creating shield housing 109 around isolator 104. As illustrated by FIGS. 8 and 9, when crimped the shape of shielding bodies 106 causes one of the output cables 102b to be routed at an angle. As also discussed above, the crimping process ensures that shield housing 109 is separated from isolator 104 by a distance $X_2$.

Once shielding bodies have been crimped, one-way body part 116 and two-way body part 130 are slid onto cables 102, as illustrated by FIG. 1. Alternatively, one-way body part 116 and two-way body part 130 may be slid onto cables 102 prior to crimping of shielding bodies 106. FIG. 8, illustrates an exemplary embodiment of the steps of sliding and attaching one-way body part 116 and two-way body part 130. As seen in step one of FIG. 8, one-way body part 116 and two-way body part 130 are slid onto cables 102. As discussed above, the shape of output end 134 and input end 132 ensures that lower output cable 102b can easily slide through the angled portion (i.e., second portion 138) while conforming to required cable bending radius requirements.

In step two, one-way body part 116 and two-way body part 130 are brought towards shielding bodies 106, thereby starting the routing process of lower output cable 102b. In the third step, one-way body part 116 and two-way body part 130 are brought in contact with each other such that body-closure fastening elements 140 and 122 contact each other and mate (e.g., snap fit). At this time the angled routing of lower cable 102b is completed (i.e., lower cable 102b is routed to be at an angle α relative to upper cable 102b).

After the body closure 110 is formed, end caps 114 and cable seals 112 are slid into place and press-it so as to seal the y-distributor on cables 102.

By routing cables 102b at different angles, cables 102b may be directed toward electrical units that are located remote from one another more easily. Moreover, by routing the cables at different angles as they exit the y-distributor less bending of the cables 102b is required to route the cables 102b to differing locations. This advantageously reduces the amount of cabling necessary while also reducing the amount of available space the cabling needs.

The invention claimed is:

1. A method for reducing a volume of air within an electrical distribution system, comprising:
providing at least one cable;
surrounding the at least one cable with an isolating unit;
placing a first shielding body on a top surface of the isolating unit;
placing a second shielding body on a bottom surface of the isolating unit, wherein placing the first shielding body and the second shielding body creates an air gap $X_1$ between the first shielding body or the second shielding body and the isolating unit;
crimping the first shielding body to the second shielding body, to create a shield housing, so that an air gap $X_2$ is created between the first shielding body or the second shielding body and the isolating unit, wherein $X_2$ is less than $X_1$.

2. The method according to claim 1, wherein placing a second shielding body on a bottom surface of the isolating unit comprising placing the second shielding body so that at least a portion of the first shielding body overlaps with the second shielding body.

3. The method according to claim 2, wherein the first shielding body or the second shielding body includes at least one flared portion, and wherein the overlap occurs at a location corresponding to the flared portion.

4. The method according to claim 3, wherein the flared portion has a length N, and wherein $N=2(X_1-X_2)$.

5. The method according to claim 1, wherein after crimping the shield housing encases the isolator.

6. The method according to claim 1, further comprising:
encasing the shield housing with a body closure,
wherein the body closure and shield housing are sized and shaped such that the shield housing cannot fit within the body closure until the crimping process has been completed.

7. The method according to claim 1, wherein surrounding the at least one cable with the isolating unit comprises connecting an isolator cover to an isolator body.

8. The method according to claim 7, wherein connecting the isolator cover to the isolator body comprises interconnecting complementary shaped ribs and grooves.

9. A method for reducing a volume of air within an electrical distribution system, comprising:
providing at least one cable;
surrounding the at least one cable with an isolating unit;
placing a first shielding body on a top surface of the isolating unit;
placing a second shielding body on a bottom surface of the isolating unit such that at least a portion of the first shielding body overlaps with the second shielding body, wherein placing the first shielding body and the second shielding body creates a gap $X_1$ between the first shielding body or the second shielding body and the isolating unit;
crimping the first shielding body to the second shielding body, to create a shield housing, so that a gap $X_2$ is created between the first shielding body or the second shielding body and the isolating unit, wherein $X_2$ is less than $X_1$; and
wherein the first shielding body or the second shielding body includes at least one flared portion, the overlap occurs at a location corresponding to the flared portion, and the flared portion has a length N, wherein $N=2(X_1-X_2)$.

10. The method according to claim 9, wherein after crimping the shield housing encases the isolator.

11. The method according to claim 9, further comprising:
encasing the shield housing with a body closure,
wherein the body closure and shield housing are sized and shaped such that the shield housing cannot fit within the body closure until the crimping process has been completed.

12. The method according to claim 9, wherein surrounding the at least one cable with the isolating unit comprises connecting an isolator cover to an isolator body.

13. The method according to claim 12, wherein connecting the isolator cover to the isolator body comprises interconnecting complementary shaped ribs and grooves.

\* \* \* \* \*